(12) United States Patent
Timpe

(10) Patent No.: US 6,449,577 B1
(45) Date of Patent: Sep. 10, 2002

(54) SELF-OPTIMIZING ADJUSTMENT ALGORITHM

(75) Inventor: Roy Harold Timpe, Blandon, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/378,829

(22) Filed: Aug. 19, 1999

(51) Int. Cl.[7] .............................................. G01R 31/28
(52) U.S. Cl. ......................... 702/118; 324/500; 714/48
(58) Field of Search ............................ 702/91, 81, 118, 702/82–84, 117, 120–123, 58, 59, 108, 124, 126, 183, 185; 330/151; 706/25; 62/215; 345/441; 73/1.88; 700/42; 714/1, 2, 51, 25, 30, 31, 48; 324/522, 519, 750, 653, 713, 719, 71.5; 438/5, 14, 10, 23; 716/4, 5, 7

(56) References Cited

U.S. PATENT DOCUMENTS

| | | | | |
|---|---|---|---|---|
| 3,751,647 A | * | 8/1973 | Meader et al. ................. | 29/574 |
| 6,258,610 B1 | * | 7/2001 | Blatchford et al. ........... | 438/14 |
| 6,265,232 B1 | * | 7/2001 | Simmons ....................... | 438/14 |
| 6,269,326 B1 | * | 7/2001 | Lejeune .......................... | 703/2 |
| 6,324,481 B1 | * | 11/2001 | Atchison et al. .............. | 702/84 |

* cited by examiner

Primary Examiner—Marc S. Hoff
Assistant Examiner—Edward Raymond

(57) ABSTRACT

A method for device testing using an adjustment algorithm including a plurality of predetermined algorithm factors and corresponding quality factors. The algorithm includes a first parameter of the device which is adjusted in order to produce a predetermined value of a second parameter based on an optimum one of the plurality of quality factors when applied to the device.

14 Claims, 4 Drawing Sheets

SELF-OPTIMIZING ADJUSTMENT ALGORITHM

FIELD OF THE INVENTION

This invention relates to testing integrated circuit devices using an algorithm which adjusts a parameter of the device in order to achieve a predetermined value for another parameter.

BACKGROUND

Often in integrated circuit (IC) testing a first parameter is adjusted to achieve a specific value in a second parameter. For example, for a given IC device, the voltage can be adjusted in order to produce a predetermined current and visa-versa. Similarly, as another example, the voltage of one component of the integrated circuit device can be adjusted in order to produce a predetermined voltage in another component; the same is true of current. However, the relationship between two parameters can be non-linear and can vary based on other parameters of a given IC device. For example, the transistor characteristics can change on a wafer-by-wafer basis. As a result, it is difficult to have one algorithm that satisfactorily handles multiple adjustments.

Previous attempts to adjust a first parameter, in order to produce a specific value in a second parameter when applied to an IC device, have involved either tailoring or customizing several algorithms for several adjustments, or using only one algorithm to handle multiple adjustments with many iterations. For example, an adjustment where the two parameters are related exponentially, such as the forward voltage versus forward current of a diode, can be accomplished by taking the log of the voltage and applying a linear interpolation/extrapolation to the relationship of the current to the log of voltage. If the two parameters have a square law relationship, it is beneficial to take the log of both parameters and apply a linear interpolation/extrapolation. In each of these cases, the resulting method will work well only for that specific case, since the method is tailored to the relationship between the parameters. These types of methods require more engineering time since the relationship must be coded into the software along with error trapping and other overhead. An adjustment routine made for an exponential will not adjust a square law relationship and visa versa. Both the expediential and square law routines will not handle a linear relationship adequately. The practice of tailoring the routine also requires a priori knowledge of the relationship between the parameters.

Therefore, there is a need for an adjustment algorithm which can handle a variety of adjustments between two related parameters.

SUMMARY OF THE INVENTION

In accordance with an exemplary embodiment of the invention, an adjustment algorithm is provided for testing components of a device. The adjustment algorithm modifies itself to adjust a first parameter of a selected device component based on a second parameter of the selected device component which is set to a predetermined value. In addition, the first parameter has a predetermined tolerance. The adjustment algorithm includes the steps of:

(1) obtaining a high limit for the first parameter, a low limit for the first parameter, a high measurement for the second parameter and a low measurement for the second parameter from a prior implementation of the adjustment algorithm to another device component;

(2) applying the first parameter test value to the integrated circuit and measuring the resulting value for the second parameter;

(3) calculating a first parameter error by the algorithm (the second parameter predetermined value—the second parameter resulting value) * (the first parameter high limit—the first parameter low limit)/(the second parameter high measurement—the second parameter low measurement);

where the first parameter error is less than the tolerance;

(4) setting the first parameter test value to an adjusted value for the first parameter, whereby the first parameter adjusted value generally approximates the second parameter predetermined value when the first parameter adjusted value is applied to the integrated circuit and the second parameter is measured; and (5) where the first parameter error is one of greater than and equal to the tolerance, calculating an adjusted value for the first parameter by the algorithm (the first parameter test value+the first parameter error)/an algorithm factor, where the algorithm factor is a positive number of at least 1.

In one embodiment according to the invention, each of the IC devices on a wafer, for example, a laser driver, are tested to determine a first parameter (e.g., voltage) which produces a predetermined second parameter (e.g., current). The predetermined current can be dependent upon operating characteristics of the wafer, operating specifications for use of the wafer, etc. Adjustment of the voltage is accomplished by the adjustment algorithm of the present invention. The adjustment algorithm initially assumes a linear relationship between the voltage and current. A voltage error calculated from the linear assumption is divided by an algorithm factor. An algorithm factor of 1 produces an adjustment based on the linear interpolation of the relationship between the voltage and the current. Increasing the value of the algorithm factor causes the algorithm to step across the adjustment range for the voltage using small steps. In the limit, a large value of the algorithm factor will cause the step size to be the smallest possible with the hardware used. Larger values for the algorithm factor can be useful with extremely nonlinear relationships. Moreover, for executions of the algorithm subsequent to its application to the initial IC device or set-up device, the algorithm uses values resulting from an application to a previous IC device. In this way, multiple applications of the algorithm increase its efficiency based on the use of values that have been successful for earlier applications. This artificial intelligence aspect of the algorithm according to the present invention reduces the time necessary to adjust the voltage to yield the predetermined current for subsequent IC devices on the wafer. In the embodiment of the invention, an optimization process calls the adjustment algorithm with different values of the algorithm factor. For the initial application of the algorithm, the algorithm factors can be determined empirically or independently of any testing of the wafer or IC devices contained thereon. In addition, a quality factor is calculated for each algorithm factor. It is desirable that the quality factor be a number having a value which expresses desirable attributes of the adjustment. It is preferable that the adjustment of the parameters be both fast and accurate. Therefore, in one embodiment, the method of calculating the quality factor is the number of iterations multiplied by the quantity of the final error summed with a constant. The resulting quality factor is a number such that the lower the value of the number, the more desirable the adjustment. The purpose of the constant added to the error is to prevent adjustments with zero error and different numbers of iterations yielding the same quality factor. In cases of zero error, it is clear that the lower number of iterations is preferable. Persons of ordinary skill in the art will appreciate that the choice of method of determining the quality factor does not limit the scope of this invention. The value of quality factor should preferably represent the desirability of the adjustment performed. In addition, in the preferred embodiment, the quality factor can either increase with increasing desirability or decrease with increasing desirability. This choice is arbitrary and does not limit the scope of the invention. A learning array stores the parameters being adjusted, the algorithm factors and the corresponding quality factors. For applications of the adjustment algorithm to subsequent IC devices on the wafer, the algorithm factor with the optimal quality factor can be used as a starting point. As a result, like the algorithm, the process uses a value, i.e., an algorithm factor, resulting from successful testing of prior IC devices on the wafer, thereby improving its efficiency. This artificial intelligence aspect of the process according to the embodiment of the invention reduces the time necessary to adjust the voltage to yield the predetermined current for subsequent IC devices on the wafer.

In addition, as the algorithm factor is varied, it has the effect of changing the behavior of the adjustment algorithm. More particularly, the adjustment algorithm is adaptable based on the optimized algorithm factor to implement a previously successful relationship between the voltage and current such that the number of iterations to arrive at the adjusted voltage yielding the predetermined current is minimized. Thus, the algorithm automatically adapts to deal with different relationships between the two parameters. Also, since different adjustment relationships between wafers are common based on transistor characteristics for a given wafer, the adjustment algorithm readily adapts itself for efficient adjustment.

Therefore, the embodiment of the invention is an adjustment algorithm which can handle a variety of adjustments and thereby overcome the problems of known approaches.

BRIEF DESCRIPTION OF THE DRAWINGS

The foregoing and other features of the present invention will be more readily apparent from the following detailed description and drawings of an illustrative embodiment of the invention wherein like reference numbers refer to similar elements throughout the several view and in which.

DETAILED DESCRIPTION OF THE ILLUSTRATIVE EMBODIMENTS OF THE INVENTION

Figure 1A:
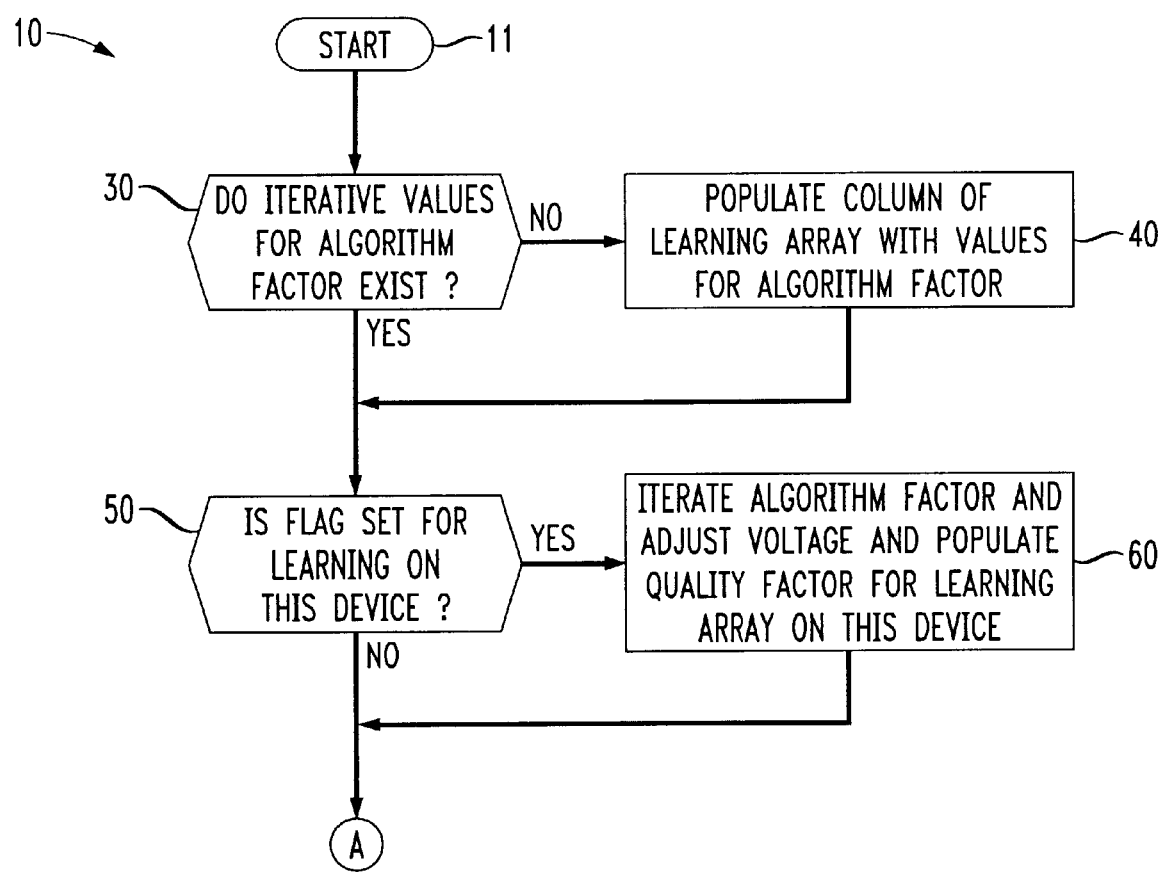
FIGS. 1A and 1B are a flow chart of the optimizing process according to an embodiment of the present invention.
Figure 1B:
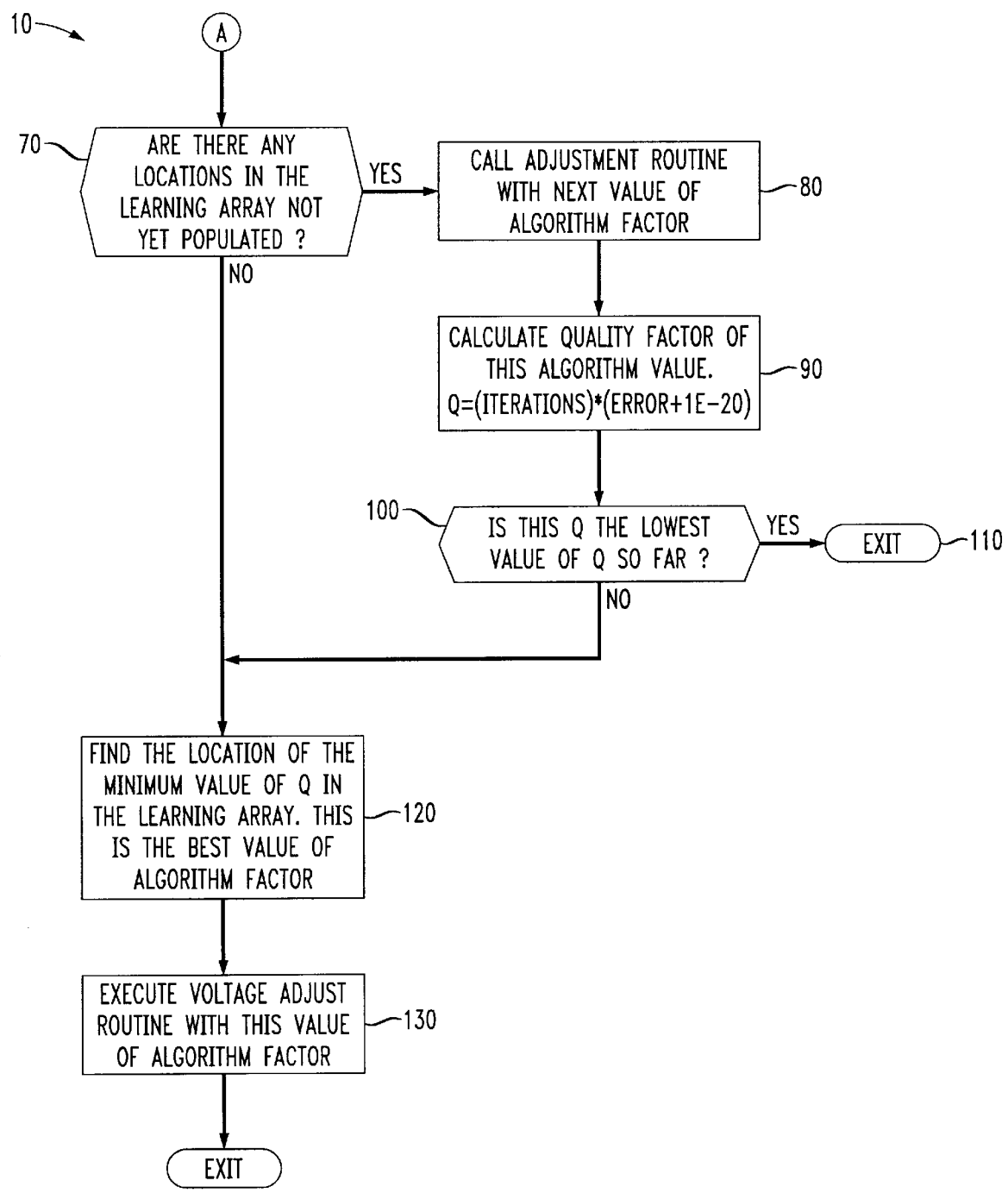

FIG. 1 is a flow chart of the optimization process 10 according to an embodiment of the present invention. FIG. 2 is a flow chart of the adjustment algorithm 200 according to the embodiment of the present invention. Each of the IC devices on a wafer, for example, laser drivers, are tested to determine a voltage which produces a predetermined current. The predetermined current can be dependent upon the operating characteristics of the wafer, the operating specifications for use of the wafer, etc. Adjustment of the voltage is accomplished by the adjustment algorithm 200 of FIG. 2.

Figure 2A:
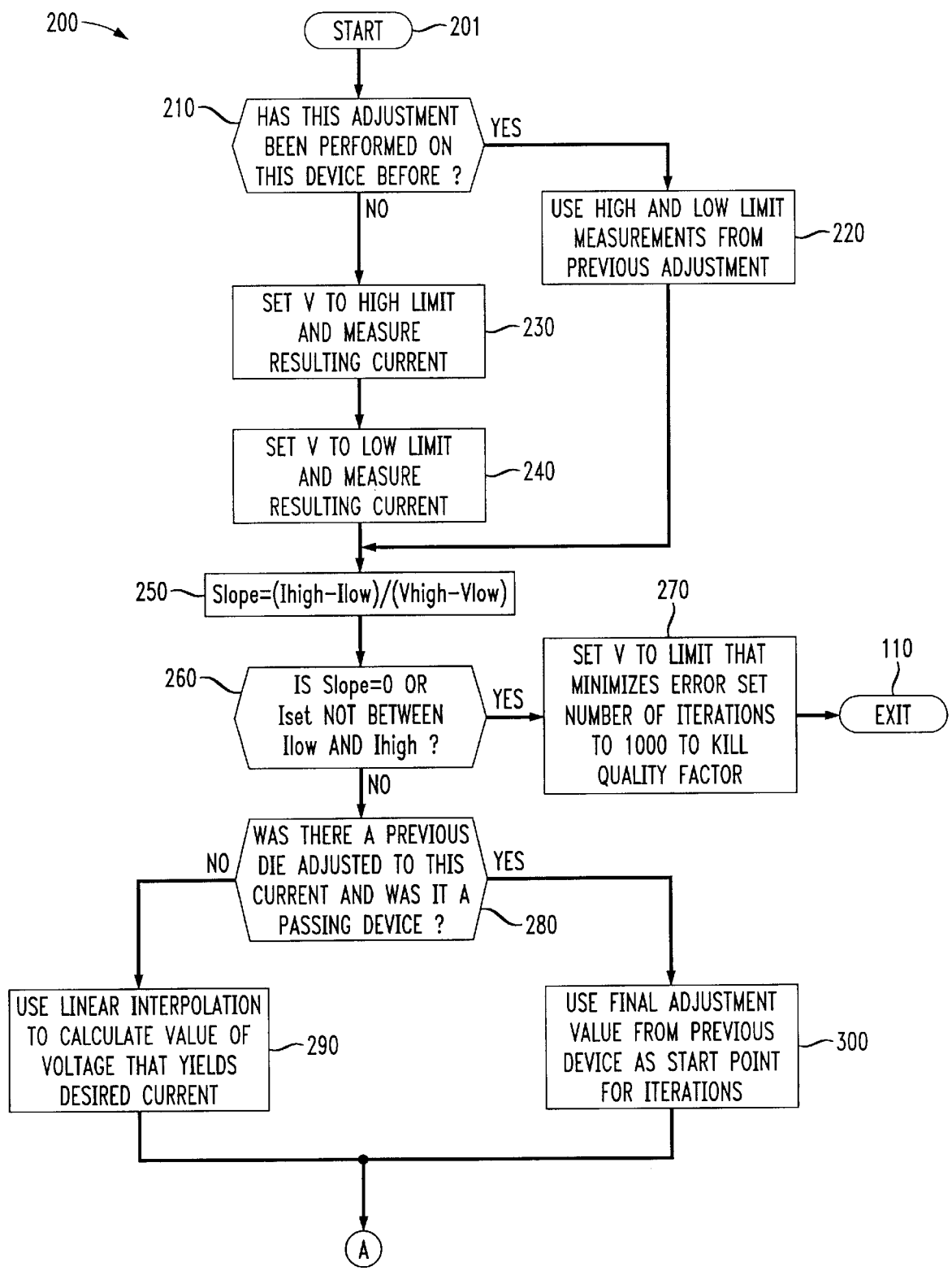
FIGS. 2A and 2B are a flow chart of the adjustment algorithm according to the embodiment of the present invention.

The adjustment algorithm 200 initially assumes a linear relationship between the voltage and current (as shown in step 290 of FIG. 2A). A voltage error calculated from the linear assumption is divided by an algorithm factor (step 380 of FIG. 2B). An algorithm factor of 1 produces an adjustment based on the linear interpolation of the relationship between the voltage and the current. Increasing the value of the algorithm factor causes the algorithm 200 to step across the adjustment range for the voltage using small steps. In the limit, a large value of the algorithm factor will cause the step size to be the smallest possible with the hardware used. Larger values for the algorithm factor can be useful with extremely nonlinear relationships. Moreover, for executions of the algorithm 200 subsequent to its application to the initial IC device or set-up device, the algorithm uses values resulting from an application to a previous IC device. In this way, multiple applications of the algorithm 200 increase its efficiency based on the use of values that have been successful for earlier applications. This artificial intelligence aspect of the algorithm 200 according to the present invention reduces the time necessary to adjust the voltage to yield the predetermined current for subsequent IC devices on the wafer.

The optimization process 10 of FIG. 1 calls the FIG. 2 adjustment algorithm 200 with different values of algorithm factor (as shown in steps 60, 80 and 130). For the initial application of the algorithm 200, the algorithm factors can be determined empirically or independently of any testing of the wafer or IC devices contained thereon. In addition, a quality factor is calculated for each algorithm factor. A learning array stores the parameters being adjusted, the algorithm factors and the corresponding quality factors. For applications of the adjustment algorithm 200 to subsequent IC devices on the wafer, the algorithm factor with the optimal quality factor can be used as a starting point. As a result, like the algorithm 200, the process 10 uses a value, i.e., an algorithm factor, resulting from successful testing of prior IC devices on the wafer, thereby improving its efficiency. This artificial intelligence aspect of the process 10 according to the present invention reduces the time necessary to adjust the voltage to yield the predetermined current for subsequent IC devices on the wafer. In addition, as the algorithm factor is varied, it has the effect of changing the behavior of the adjustment algorithm 200. More particularly, the adjustment algorithm 200 is adaptable based on the optimized algorithm factor to implement a previously successful relationship between the voltage and current such that the number of iterations to arrive at the adjusted voltage yielding the predetermined current is minimized. Thus, the algorithm 200 automatically adapts to deal with different relationships between the two parameters. Also, since different adjustment relationships between wafers are common based on transistor characteristics for a given wafer, the adjustment algorithm readily adapts itself for efficient adjustment.

A specific example of the effect of the algorithm factor on the adjustment algorithm 200 demonstrates its flexibility. Suppose the adjusted voltage is controlled by a 10 bit digital to analog converter ("DAC"). In this case, there would be 1024 possible values of the independent parameter. It follows there are also 1024 possible values of the parameter being adjusted. If the relationship between these parameters were linear, then the algorithm factor of one would be used by the optimization process 10 in order to yield the optimal quality factor. In this case, the adjustment algorithm 200 would most likely produce the correct value for the adjusted parameter on the first iteration. This is because the independent parameter would be set twice to calculate the slope, and the third setting (the first iteration) would be a linear interpolation yielding the correct value for the adjusted parameter. As another example, the more non-linear the relationship between the parameters, the larger the value for the algorithm factor. At an extreme non-linear relationship, the large algorithm factor value can cause the adjustment algorithm 200 to behave like a simple search in which all of the values of the independent parameter are used until the parameter being adjusted is within a tolerance. In this scenario, the adjustment algorithm 200 could take more than 500 iterations to reach the correct value for the adjusted parameter.

The FIG. 1 optimization process 10 will now be described in greater detail. In one application of processes 10 and 200, each of the integrated circuit (IC) devices on a wafer, for example, laser drivers are tested to determine the voltage which will produce a given current when applied to the IC. This application is exemplary in that the invention is not limited to either a particular device which is tested or particular parameters. Rather, the wafer and adjustable voltage for a given current are exemplary. Persons of ordinary skill in the art will appreciate that the range of devices to which the optimization process 10 and adjustment algorithm 200 can be applied is broad, including, for example, reference bias current versus amplifier gain or a specific node voltage (for analog circuits), gate voltage versus drain current for a FET transistor, base current versus collector current for a bipolar junction transistor etc. In addition, such persons will appreciate that any two related parameters can be calculated based on the process 10 and algorithm 200 including, for example, an adjustable current based on a given voltage or an adjustable current based on a separate given current, etc.

Referring to FIG. 1, the process 10 starts (step 11) with accessing the learning array to determine whether iterative values for the algorithm factors exist (step 30). If not, in step 40, the learning array is populated with iterative algorithm factor values. Such values can be determined empirically or by any analytical technique; the method for determining the algorithm factor values does not limit the scope of the invention. Therefore, for the first IC device tested on a wafer (e.g., the set-up IC device), the learning array will be empty in response to the step 30 question and populated based on step 40. If the answer to the question in step 30 is yes, such as, for example, when a successive IC device on a single wafer is being tested, or step 40 is completed, then the process 10 continues with step 50.

In step 50, the question is presented as to whether a flag is set for learning on the particular IC device. If the answer to the step 50 question is yes, in step 60, FIG. 2 is called in order to provide values to the FIG. 1 process 10 for calculating a quality factor for each algorithm factor. In one embodiment, the flag is set such that the learning array can be populated based on a single IC device. It has been found that using a single known good device for populating the learning array maximizes the use of an operative IC device (since some IC devices on the wafer are operative and others are not) for producing accurate algorithm and quality factors. If the answer to the question in step 50 is no, or step 60 has been completed, the process 10 (in step 70 of FIG. 1B) asks whether there are any locations in the learning array which have not yet been populated. Where the flag is set such that there is an affirmative response to step 50, the answer to the question in step 70 is no. However, where the flag is not set, the answer to the step 70 question can be yes. In this alternative situation, successive IC devices can be used to populate the quality factors in the learning array. However, it has been determined in practice that this is less desirable than having a single IC device populate the learning array because the chances of encountering an inoperative IC device while checking successive devices, and the resulting level of inaccurate values produced by such a device, can hinder the efficiency gain by using the adjustment algorithm 200. Accordingly, where the answer to step 70 question is yes, steps 80 to 100 are processed. In step 80, the process 10 calls the FIG. 2 adjustment algorithm 200 for the next value in the learning array of the algorithm factor. Once the algorithm 200 has been executed, the process 10 (in step 90 of FIG. 1B) calculates the quality factor corresponding to that algorithm factor according to the following formula:

Quality factor=iterations * [voltage error+10^(−20)]

(iterations and voltage error will be further described in reference to FIG. 2, below).

The process 10 (in step 100) then analyzes the value of the quality factor to determine whether it is the lowest value in the learning array. Where the answer to the step 100 question is yes, the process 10 is completed as to the current IC device (step 110). At this point, the process 10 is reinitiated for the next successive IC device beginning with start in step 10. Where the answer to the question in step 100 is no, the process 10 continues with step 120. In this way, for example, where the process 10 is applied to IC devices which do not have a flag set for learning, steps 70 to 100 will populate a single quality factor per IC device before either ending in step 110 or continuing processing in step 120.

In step 120, the process 10 finds the location of the minimum quality factor value in the learning array and identifies its corresponding algorithm factor. Then, in step 130, the FIG. 2 adjustment algorithm 200 is called using the algorithm factor in order to determine the adjusted voltage for the current IC device. The completion of step 120 ends process 10 for the current IC device. Process 10 is then reinitiated for the next successive IC device in step 11.

The FIG. 2 adjustment algorithm 200 will now be described in detail. The algorithm is called from steps 60, 80 and 130 in the FIG. 1 process 10. The algorithm 200 is initiated in step 201. The algorithm 200 (in step 210) then asks whether an adjustment was previously performed on the current IC device. The answer to the step 210 question can be yes where, for example, the device is being tested at more than one current setting. Where the answer to the step 210 question is yes, the following values are used from a previous adjustment: high and low limits for the voltage, and measured high and low currents resulting from applying the high and low voltage limits to the current IC device. Where the answer to the step 210 question is no, the high and low voltage limits are set based on predetermined values (steps 230 and 240). In addition, the measured high and low currents once again result from applying such predetermined high and low limits to the current IC device (steps 230 and 240). Where step 220 is implemented, the algorithm 200 is optimized because the previous high and low voltage limits and the resulting measured high and low currents are used, thus saving time, since measuring these values again would add no benefit to the test. In this way, use of the values from previous adjustments increases the efficiency of the algorithm 200. The algorithm 200 continues with step 250.

The algorithm (in step 250) calculates a slope for the current IC device. The slope is determined by the formula:

slope=(high measured current—low measured current)/(high voltage limit—low voltage limit).

The algorithm 200 then continues with step 260. As described above in brief, in step 260, the algorithm 200 compares the value of the slope to known appropriate value ranges. More particularly, if the slope equals 0 or if the predetermined current (or the set current for which algorithm 200 seeks to adjust the voltage in order to yield the current) is not between the high measured current and the low measured current, then the current IC device is not functioning properly (or is a bad or "silly" device). In this case, the algorithm 200 ends with step 110 and the current device is deemed to be bad and its parameters ignored. Subsequently, FIG. 1 is reinitiated for the next successive IC device. Where the answer to the question in step 260 is no, the slope value indicates that the current IC device is functioning properly (or is a passing device) and the algorithm 200 continues with step 280.

In step 280, the question is whether a previous IC device was adjusted to the predetermined current and whether the device was a passing device. In the event of a negative response to the question in step 280, a linear interpolation is implemented based on the high and low voltage limits, and the high and low measured current, in order to plot an adjusted voltage for the predetermined current (step 290). If the answer to the question is yes, then the previous adjusted voltage used in the prior adjustment is applied to the present adjusted voltage as a starting point for the subsequent processing steps (step 300). Regardless of whether step 290 or 300 is executed, the result of steps 280 to 300 is to produce a value for the current adjusted voltage. The algorithm continues processing with steps 310 to 390.

Figure 2B:
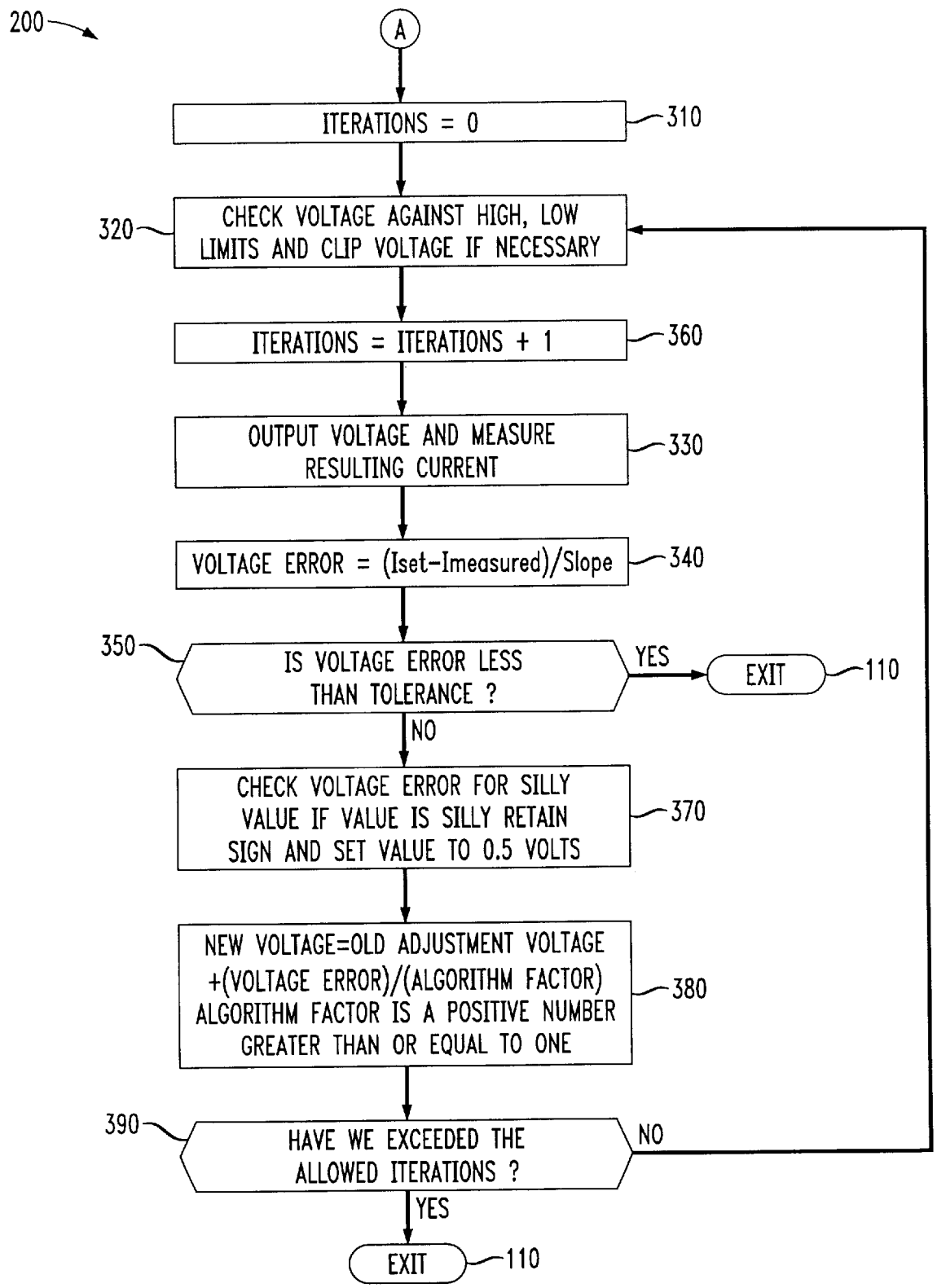

In step 310 of FIG. 2B, an iterations counter is set to zero. The iterations counter is relevant to the number of times steps 320 to 380 are executed. Therefore, the iterations counter can be set at any time before the execution of step 320. In Step 320, the current adjusted voltage resulting from steps 280 to 300 is checked against the high and low voltage limits to determine whether it falls within that range. An adjusted voltage outside of the high/low limit indicates that the IC device being tested may be a failing device, or some other error has occurred. In this case, the adjusted voltage can be set to the high limit, if it is greater than the high limit, or to the low limit, if it is less than the low limit, in order to set it to a value which will not skew the results of the algorithm 200. If the aberrant voltage was the result of a measurement error, setting to one of the limits will give the opportunity for the adjustment to recover. In alternative embodiments, other methods of modifying or ignoring an aberrant adjusted voltage can be employed. For example, the adjusted voltage can be set to a predetermined value rather than being set to the high or low limit. In still further alternative embodiments, the algorithm 200 can end and, accordingly, the IC device can be passed over as a failing device. The action taken when an aberrant adjusted voltage for a given IC device is encountered does not limit the scope of the present invention. Furthermore, in alternative embodiments according to the present invention, the adjusted voltage can be tested against another range of appropriate values than the high/low voltage limit, such as, e.g., a broader range including a tolerance consideration. The range of appropriate values tested in step 320 does not limit the scope of the invention. Moreover, in an alternative embodiment according to the present invention, this step 320 can be eliminated based on analyzing the IC device being tested before initiating the algorithm 200 and/or the process 100 or any other approach to ensure that the adjusted voltage will fall within a specified range, such as, e.g., the high/low limit for the voltage.

The algorithm 200 continues with steps 330 to 350. In step 330, the adjusted voltage is applied to the IC device and the resulting current is measured (also referred to as the measured current). Then, a voltage error is calculated based on the formula:

Voltage error=(predetermined current—measured current)/slope.

Step 350 follows in which the question of whether the voltage error is less than a predetermined tolerance is asked. The predetermined tolerance can be determined empirically or can be based on the characteristics of the IC device and/or the wafer, etc. The method for setting the predetermined tolerance and its value do not limit the scope of the invention. Rather, persons of ordinary skill in the art will select the tolerance as merely a design choice. Where the voltage error is less than the tolerance, the algorithm 200 ends (step 110). This is because the adjusted voltage is deemed to be within an acceptable range of the actual voltage which yields the predetermined current when applied to the IC device. Alternatively the error tolerance could be applied to the measured current rather than the measured voltage, persons of ordinary skill in the art will recognize that the two are equivalent. Accordingly, the adjusted voltage is the optimal voltage based on the algorithm 200 for the current IC device. Subsequently, the process 100 can be reinitiated for the next IC device. If instead the answer to the question in step 350 is no, the algorithm 200 continues processing with steps 360 to 390.

In step 360, the iterations counter is incremented by one. Since the iterations counter measures the number of times steps 320 to 380 are implemented, it can be incremented at any time before step 390.

Step 370 regards checking the voltage error for a "silly" value. If the voltage error is greater than 50% of the difference between the high and low limits the magnitude of voltage error is set to 50% of the difference between the high low limits and the sign of the original error is retained. This is advantageous since linear relationships are already adjusted closely due to step 290 and a large voltage step is not likely to be advantageous in a non-linear adjustment. The predetermined "silly" value or range of values can be determined empirically or can be based on the characteristics of the IC device and/or the wafer, etc. The method for setting the predetermined tolerance and its value do not limit the scope of the present invention. In addition, the value and/or sign which is applied to the adjusted voltage where the adjusted voltage is equal to the silly value can be determined empirically or can be based on characteristics of the IC device and/or wafer etc. Such value and its determination do not limit the scope of the invention. Further, in alternative embodiments, step 370 can determine whether the adjusted voltage falls within a range of silly values. Rather, persons of ordinary skill in the art will determine the silly value, the range of voltages near the silly value which are problematic as well as a modified adjusted voltage value as a design choice.

Moreover, in alternative embodiment according to the present invention, this step 370 can be eliminated based on analyzing the IC device being tested before initiating the algorithm 200 and/or the process 100 or any other approach to ensure that the adjusted voltage will fall within a specified range, such as, e.g., outside of the silly range.

The algorithm 200 continues with step 390 in which the a new value for the adjusted voltage is calculated based on the following formula:

Adjusted voltage=current adjusted voltage+(voltage error/algorithm factor), where the algorithm factor was passed to the algorithm 200 from the process 10.

The algorithm 200 then continues with step 390, in which the question is whether the number of iterations has exceeded a predetermined amount. The predetermined allowable iterations can be determined empirically or can be based on the characteristics of the IC device and/or the wafer etc. The method for setting the predetermined number of allowed iterations and its value do not limit the scope of the invention. Rather, persons of ordinary skill in the art will select the tolerance as a design choice. Where the number of iterations has not been exceeded, the answer to the question in step 390 is "no" and the algorithm 200 returns to step 320. Upon implementing steps 320 to 380 again, the iterations counter is incremented again (step 360). Accordingly, a loop of steps 320 to 390 continues until the number of iterations exceeds the allowable number and while the adjusted voltage is greater or equal to the predetermined tolerance. Where the adjusted voltage is not less than the predetermined tolerance, as analyzed in step 350, and the allowable iterations is exceeded, the algorithm 200 ends and the adjusted voltage based on the last execution of step 380 is applied to the current IC device. Subsequently, the process 100 can be reinitiated for the next successive IC device.

An example of an implementation of the optimization process 10 and the adjustment algorithm process 200 is now described. The processes were implemented on a laser driver with Lucent Technologies package device part number 1626DXC. The predetermined values for this implementation, whether they are based on specifications of the wafer, technical requirements for use of the wafer or the values of previous IC devices tested on the wafer, are:

Voltage high limit: 5.2 volts;
  Voltage low limit: 4.2 volts;
  Slope=−0.0948
  Tolerance=0.01
  Silly value=50% of the difference between voltage high limit and voltage low limit.

| Algorithm Factor | Quality Factor |
|---|---|
| 1 | 0.003 |
| 1.333 | 0.0002 |
| 1.667 | 0.0004 |
| 2 | 0.0009 |
| 2.333 | 0.003 |
| 2.667 | 0.0032 |
| 3 | 0.0035 |
| 3.33 | 0.0036 |

In this example, the minimum value for the quality factor is at algorithm factor equal to 1.333.

It will be appreciated by persons of ordinary skill in the art that the process 10 and the algorithm 200 can be applied to a variety of devices, including, for example, reference bias current versus amplifier gain or a specific node voltage (for analog circuits), gate voltage versus drain current for a FET transistor, base current versus collector current for a bipolar junction transistor, etc. In addition, such persons will further appreciate that the number of parameters to which the process 10 and the algorithm 200 apply can be increased. This is because in one aspect of the present invention, the particular algorithm 200, which is used to adjust the voltage or another first parameter, uses values which have been applied to prior tested devices. Therefore, the efficiency of the algorithm 200 is improved because rather than starting with an unverified value, the starting values can be based on prior testing of similar devices. In this way, the algorithm 200 learns as it tests further devices. This artificial intelligence principle is demonstrated in steps 220, 300 and 380, for example, in the algorithm 200. Furthermore, it can be appreciated by those of ordinary skill in the art that the embodiment set forth in the process 10 and algorithm 200 of voltage for a first parameter and current for a second parameter are merely exemplary. Accordingly, the invention is equally applicable to any two parameters in a preferred embodiment or a greater number of parameters (as described above) in alternative embodiments.

While the invention has been particularly shown and described with reference to preferred embodiments thereof, it will be understood by those skilled in the art that various changes in form and details may be made therein without departing from the spirit and scope of the invention.

I claim:

1. A method for testing components of a device using an adjustment algorithm which modifies itself to adjust a first parameter of a selected device component based on a second parameter of the selected device component which is set to a predetermined value, said first parameter includes a predetermined tolerance, comprising the steps of:

(a) obtaining each of a high limit for said first parameter, a low limit for said first parameter, a high measurement for said second parameter and a low measurement for said second parameter, from a prior implementation of the adjustment algorithm to another device component;

(b) applying said first parameter test value to the device and measuring the resulting value for said second parameter;

(c) calculating a first parameter error by the algorithm (said second parameter predetermined value—said second parameter resulting value) * (said first parameter high limit—said first parameter low limit)/(said second parameter high measurement—said second parameter low measurement);

(d) where said first parameter error is less than said tolerance, setting said first parameter test value to an adjusted value for said first parameter, whereby said first parameter adjusted value generally approximates said second parameter predetermined value when said first parameter adjusted value is applied to the device and said second parameter is measured; and (e) where said first parameter error is one of greater than and equal to said tolerance, calculating an adjusted value for said first parameter by the algorithm (said first parameter test value+said first parameter error)/an algorithm factor, where said algorithm factor is a positive number of at least 1.

2. A method according to claim 1 wherein a number of allowed iterations is predetermined, further comprising the steps of:

(f) before step (b), setting an iterations counter to 0;

(g) after step (e), where said first parameter error is greater than about tolerance, changing said first parameter test value to equal said first parameter adjusted value, incrementing said iterations counter by 1 and repeating steps (b) to (g) until said iterations counter is equal to said allowed iterations, whereby said first parameter adjusted value generally approximates said second parameter predetermined value when said first parameter adjusted value is applied to the device and said second parameter is measured.

3. A method according to claim 2 wherein said first parameter includes a silly value which indicates an error in said first parameter value and step (g) further comprises comparing said first parameter test value to said silly value and where said first parameter test value is within a certain range of said silly value, modifying said first parameter test value to a predetermined test value having the same sign as said first parameter test value.

4. A method for testing components of a device using an adjustment algorithm which modifies itself to adjust a first parameter of a selected device component based on a second parameter of the selected device component which is set to a predetermined value, said first parameter includes a predetermined tolerance, comprising the steps of:

(a) determining a high limit for said first parameter, a high measurement for said second parameter, a low limit for said first parameter and a low measurement for said second parameter;

(b) determining a slope by the algorithm (said second parameter high measurement—said second parameter low measurement)/(said first parameter high limit—said first parameter low limit);

(c) identifying a test value for said first parameter which mathematically approximates said second parameter predetermined value;

(d) applying said first parameter test value to the device and measuring the resulting value for said second parameter;

(e) calculating a first parameter error by the algorithm (said second parameter predetermined value—said second parameter resulting value)/said slope;

(f) where said first parameter error is less than said tolerance, setting said first parameter test value to an adjusted value for said first parameter, whereby said first parameter adjusted value generally approximates said second parameter predetermined value when said first parameter adjusted value is applied to the device and said second parameter is measured; and (g) where said first parameter error is one of greater than and equal to said tolerance, calculating an adjusted value for said first parameter by the algorithm (said first parameter test value+said first parameter error)/an algorithm factor, where said algorithm factor is a positive number of at least 1.

5. A method according to claim 4 wherein a number of allowed iterations is predetermined, further comprising (h) before step (d), setting an iterations counter to 0;

(i) after step (g), where said first parameter error is greater than about tolerance, changing said first parameter test value to equal said first parameter adjusted value, incrementing said iterations counter by 1, and repeating steps (d) to (i) until said iterations counter is equal to said allowed iterations, whereby said first parameter adjusted value generally approximates said second parameter predetermined value when said first parameter adjusted value is applied to the device and said second parameter is measured.

6. A method according to claim 5 wherein said first parameter includes a silly value which indicates an error in said first parameter value and step (i) further comprises comparing said first parameter test value to said silly value and where said first parameter test value is in a predetermined range about said silly value, modifying said first parameter test value to a predetermined test value having the same sign as said first parameter test value.

7. A method according to claim 4 wherein step (a) includes setting a high limit for said first parameter and measuring the resulting second parameter for said second parameter high measurement, and setting a low limit for said first parameter and measuring the resulting second parameter for said second parameter low measurement.

8. A method according to claim 4 wherein step (a) includes obtaining a high limit from a previous adjustment for said first parameter and measuring the resulting second parameter for said second parameter high measurement, and obtaining a low limit from a previous adjustment for said first parameter and measuring the resulting second parameter for said second parameter low measurement.

9. A method according to claim 4 wherein said step (c) further comprises modifying said test value for said first parameter if said test value is outside a range of acceptable test values.

10. A method according to claim 9 wherein said modifying step further comprises plotting said test value based on one of linear interpolation using said high limit of said first parameter, said low limit of said first parameter, said high measurement of said second parameter and said low measurement of said second parameter and obtaining said test value from a previous test of a device component.

11. A method according to claim 4 wherein said step (c) further comprises determining whether said first parameter test value is within a range of acceptable test values.

12. A method according to claim 11 wherein said range of acceptable test values is between about said high limit for said first parameter and about said low limit for said second parameter.

13. A method according to claim 12 wherein said step (c) further comprises setting said first parameter test value to said first parameter high limit if said test value is greater than said first parameter high limit and setting said first parameter test value to said first parameter low limit if said test value is less than said first parameter low limit.

14. A method for device testing using an adjustment algorithm including a plurality of predetermined algorithm factors and corresponding quality factors, said algorithm includes a first parameter of the device which is adjusted in order to produce a predetermined value of a second parameter based on an optimum one of said plurality of quality factors when applied to the device, comprising the steps of:

(A) populating an array with said plurality of predetermined algorithm factors;

(B) for one of said predetermined algorithm factors (a) determining a high limit for said first parameter, a high measurement for said second parameter, a low limit for said first parameter and a low measurement for said second parameter;

(b) determining a slope by the algorithm (said second parameter high measurement—said second parameter low measurement)/(said first parameter high limit—said first parameter low limit);

(c) identifying a test value for said first parameter which approximates said second parameter predetermined value;

(d) setting an iterations counter to 0;

(e) applying said first parameter test value to the device and measuring the resulting value for said second parameter;

(f) calculating a first parameter error by the algorithm (said second parameter predetermined value—said second parameter resulting value)/said slope;

(g) where said first parameter error is less than said tolerance, setting said first parameter test value to an adjusted value for said first parameter, whereby said first parameter adjusted value generally approximates said second parameter predetermined value when said first parameter adjusted value is applied to the device and said second parameter is measured;

(h) where said first parameter error is one of greater than and equal to said tolerance, calculating an adjusted value for said first parameter by the algorithm (said first parameter test value+said first parameter error/an algorithm factor, where said algorithm factor is a positive number of at least 1;

(i) where said first parameter error is greater than about the tolerance:
  (j) changing said first parameter test value to equal said first parameter adjusted value, and
  (k) incrementing said iterations counter by 1 and repeating steps (d) to (k) until said iterations counter is equal to said allowed iterations, whereby said first parameter adjusted value generally approximates said second parameter predetermined value when said first parameter adjusted value is applied to the device and said second parameter is measured;

(C) calculating one of said quality factors corresponding to said one predetermined algorithm factors by the algorithm (iterations) * [first parameter error+10^(−20)]

and populating said array with said one quality factor and said first parameter adjusted value corresponding to said one predetermined algorithm factor;

(D) repeating steps (B) and (C) for each remaining one of said plurality of predetermined algorithm factors; and (E) identifying the lowest value for said plurality of quality factors in said array, whereby said first parameter adjusted value corresponding to said lowest value quality factor generally approximates said second parameter predetermined value when said first parameter adjusted value is applied to the device and said second parameter is measured.

* * * * *